(12) United States Patent
Baiocchi et al.

(10) Patent No.: US 8,610,215 B2
(45) Date of Patent: Dec. 17, 2013

(54) ALLOTROPIC OR MORPHOLOGIC CHANGE IN SILICON INDUCED BY ELECTROMAGNETIC RADIATION FOR RESISTANCE TURNING OF INTEGRATED CIRCUITS

(75) Inventors: Frank A. Baiocchi, Allentown, PA (US); James T. Cargo, Bethlehem, PA (US); John M. DeLucca, Wayne, PA (US); Barry J. Dutt, Pen Argyl, PA (US); Charles Martin, Windgap, PA (US)

(73) Assignee: Agere Systems LLC, Wilmington, DE (US)

( * ) Notice: Subject to any disclaimer, the term of this patent is extended or adjusted under 35 U.S.C. 154(b) by 119 days.

(21) Appl. No.: 13/119,005

(22) PCT Filed: Sep. 19, 2008

(86) PCT No.: PCT/US2008/076976
§ 371 (c)(1),
(2), (4) Date: Mar. 15, 2011

(87) PCT Pub. No.: WO2010/033122
PCT Pub. Date: Mar. 25, 2010

(65) Prior Publication Data
US 2011/0163419 A1    Jul. 7, 2011

(51) Int. Cl.
*H01L 33/16*     (2010.01)
(52) U.S. Cl.
USPC ..... 257/359; 257/380; 257/581; 257/E27.006

(58) Field of Classification Search
USPC ......... 257/154, 209, 245, 529, 489, 536, 767, 257/E27.006, E29.141, E29.176, E21.294, 257/E21.497, E21.592, 359, 380, 581; 438/171, 190, 210, 238, 329–331, 438/381–384
See application file for complete search history.

(56) References Cited

U.S. PATENT DOCUMENTS

| | | | | |
|---|---|---|---|---|
| 4,467,519 | A | * | 8/1984 | Glang et al. ................. 438/330 |
| 4,528,582 | A | * | 7/1985 | Cohen et al. ................. 257/538 |
| 5,233,327 | A | | 8/1993 | Bartush et al. |
| 6,537,869 | B1 | * | 3/2003 | Furuhata ..................... 438/239 |
| 6,647,614 | B1 | | 11/2003 | Ballantine et al. |
| 7,038,297 | B2 | * | 5/2006 | Voorde et al. ................ 257/536 |
| 7,238,582 | B2 | * | 7/2007 | Shimamoto et al. ......... 438/332 |

(Continued)

FOREIGN PATENT DOCUMENTS

| | | |
|---|---|---|
| JP | 1-135059 A | 5/1989 |
| JP | 1135059 A | 5/1989 |
| WO | 0193283 A1 | 6/2001 |
| WO | 0193283 A1 | 12/2001 |
| WO | 2010033122 A1 | 3/2010 |

OTHER PUBLICATIONS

Peterstrom, S., et al.; "CW Laser Annealing of Boron Implanted Polycrystalline Silicon"; Solid State Electronics, vol. 28, No. 4, Apr. 1, 1985; pp. 339-344.

*Primary Examiner* — Cuong Q Nguyen
*Assistant Examiner* — Yosef Gebreyesus
(74) *Attorney, Agent, or Firm* — Hitt Gaines, PC

(57) ABSTRACT

An electronic device includes a semiconductor substrate and a dielectric layer over the substrate. A resistive link located over the substrate includes a first resistive region and a second resistive region. The first resistive region has a first resistivity and a first morphology. The second resistive region has a second resistivity and a different second morphology.

8 Claims, 14 Drawing Sheets

(56) References Cited

U.S. PATENT DOCUMENTS

| | | |
|---|---|---|
| 8,115,239 B2 * | 2/2012 | Lankhorst et al. ............ 257/246 |
| 2003/0161178 A1 * | 8/2003 | Tran .............................. 365/158 |
| 2003/0207544 A1 * | 11/2003 | Shimamoto et al. .......... 438/382 |
| 2005/0062587 A1 * | 3/2005 | Yang et al. .................... 338/311 |
| 2005/0101097 A1 | 5/2005 | Shimamoto et al. |
| 2005/0110096 A1 * | 5/2005 | Ballantine et al. ............ 257/369 |
| 2007/0229212 A1 * | 10/2007 | Ballantine et al. ............ 338/195 |
| 2008/0165569 A1 * | 7/2008 | Chen et al. .................... 365/163 |

* cited by examiner

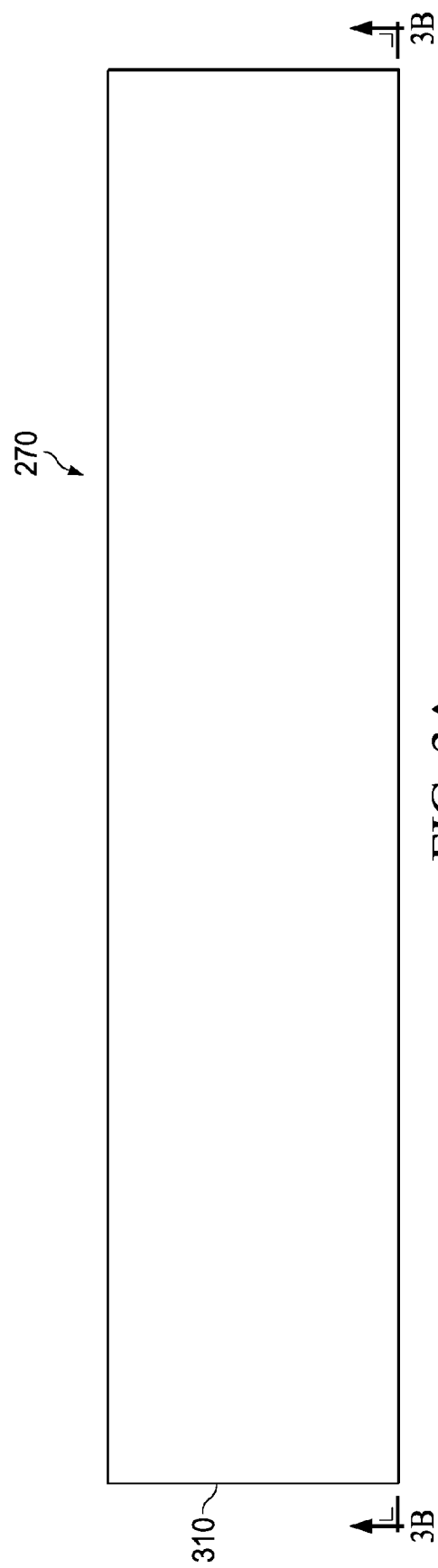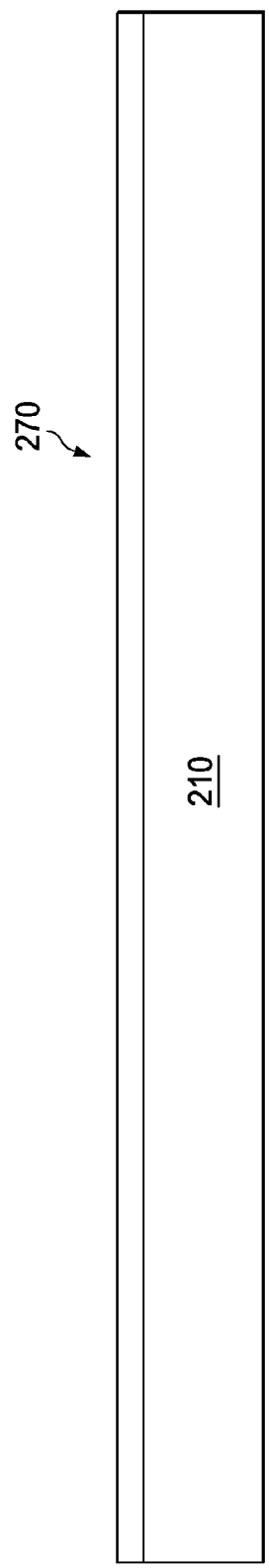
FIG. 3A
FIG. 3B

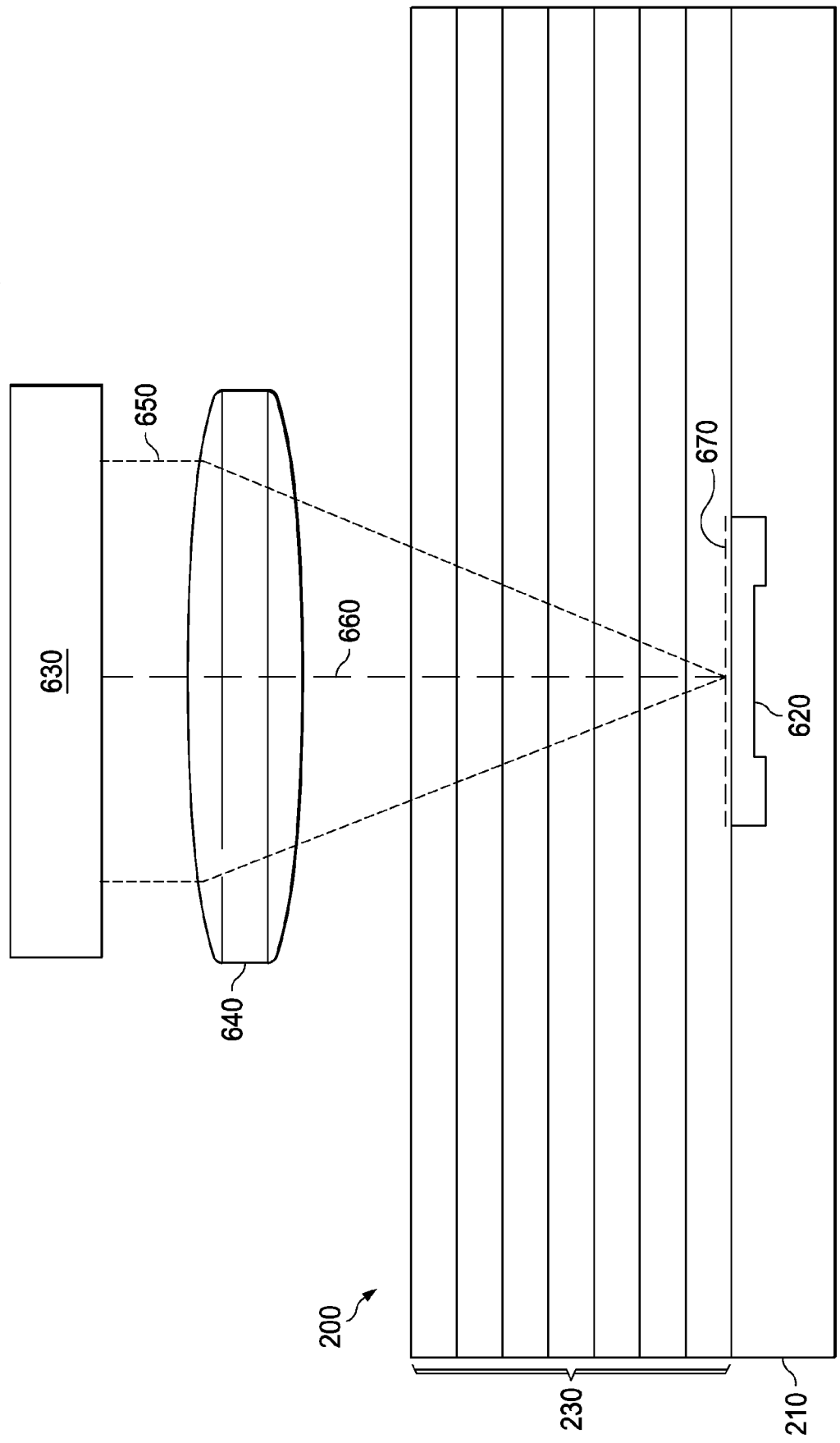

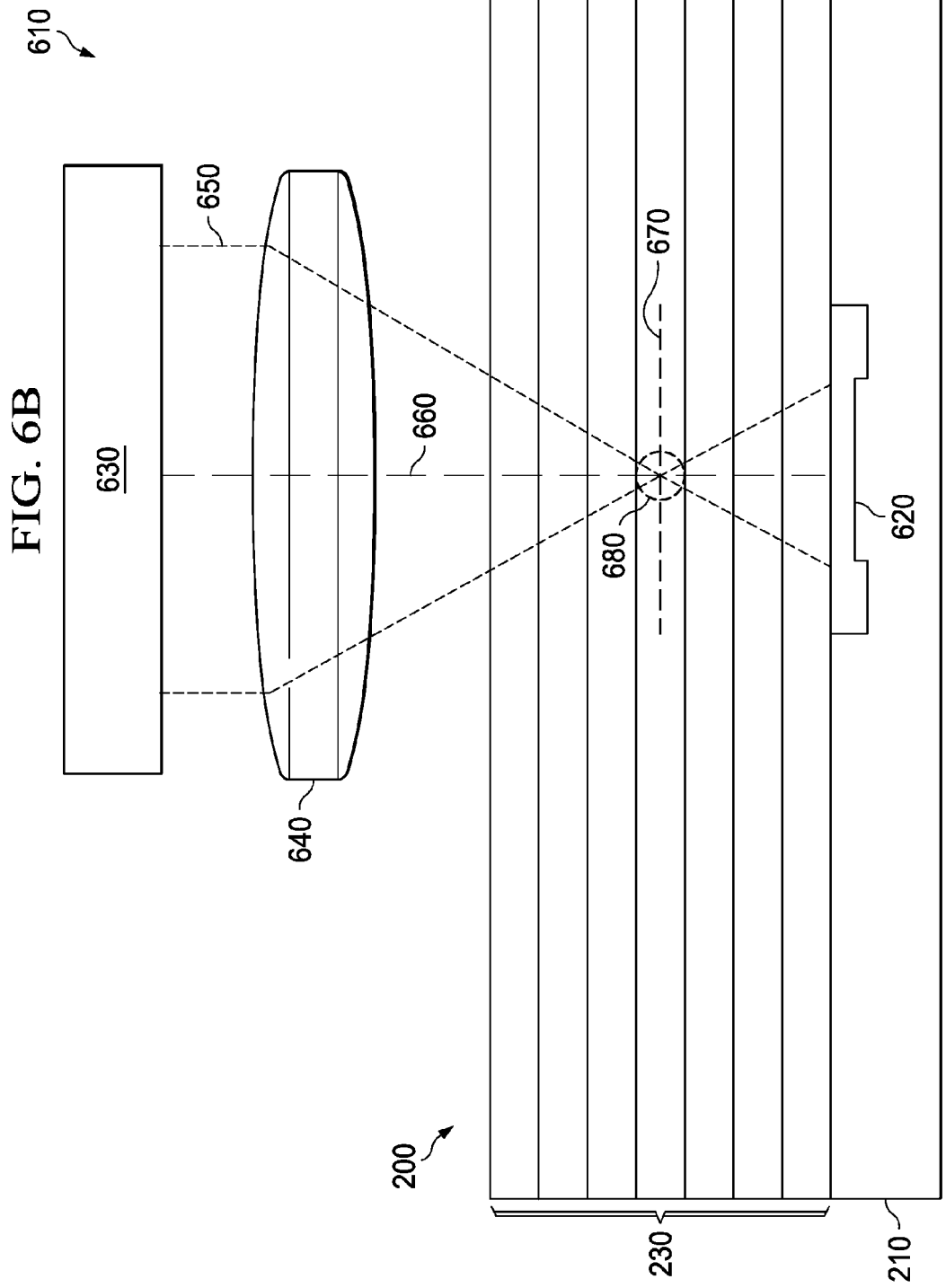

ALLOTROPIC OR MORPHOLOGIC CHANGE IN SILICON INDUCED BY ELECTROMAGNETIC RADIATION FOR RESISTANCE TURNING OF INTEGRATED CIRCUITS

CROSS-REFERENCE TO RELATED APPLICATION

This application is the National Stage of, and therefore claims the benefit of, International Application No. PCT/US2008/076976 filed on Sep. 19, 2008, entitled "ALLOTROPIC OR MORPHOLOGIC CHANGE IN SILICON INDUCED BY ELECTROMAGNETIC RADIATION FOR RESISTANCE TUNING OF INTEGRATED CIRCUITS," which was published in English under International Publication Number WO 2010/033122 A1 on Mar. 25, 2010. The above application is commonly assigned with this National Stage application and is incorporated herein by reference in its entirety.

TECHNICAL FIELD

This disclosure relates generally to semiconductor manufacturing, and, more particularly, to altering resistor values in integrated circuits.

BACKGROUND

Incorporation of fusible links into an integrated circuit design is a well-known method of providing for the alteration of fabricated IC devices to repair defects. The method typically includes the use of electrical power or laser irradiation to open a fusible link fuse. Other methods used to alter IC devices include design revision and focused ion beam (FIB) modification, both of which generally involve considerable expense.

The severing of fusible links is a destructive process that is used to remove circuit elements from active use. Thus, metal fuses, for example, typically reside near the surface of the device (at an upper interconnect level) so that they can be blown without impact to other materials or circuit elements nearer to the substrate. Collateral damage from the fuse-opening process is a reliability concern that may result in decreased device yield and/or early failure after delivery to a customer.

SUMMARY

One embodiment provides an electronic device. The electronic device includes a substrate and a dielectric layer over the substrate. A resistive link is located between the substrate and dielectric layer. The link includes a first resistive region and a second resistive region. The first resistive region includes a semiconductor that has a first resistivity and a first morphology. The second resistive region includes the semiconductor having a second resistivity and a different second morphology.

Another embodiment is a method of manufacturing an electronic device. In one step, the method provides a semiconductor substrate with a dielectric layer formed thereover, and a resistor between the substrate and the dielectric. The resistor includes a semiconductor having a first morphology. In another step, the resistor is illuminated with electromagnetic radiation. In another step, a portion of the resistor is converted by the illumination from the first morphology to a different second morphology of the semiconductor.

The foregoing has outlined features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIGS. 3A and 3B illustrate plan and sectional views, respectively, of a resistive link formed from a single-crystal portion of a semiconductor substrate;

FIGS. 6A and 6B illustrate a light source configured to illuminate a semiconductor resistor;

DETAILED DESCRIPTION

Figure 1:
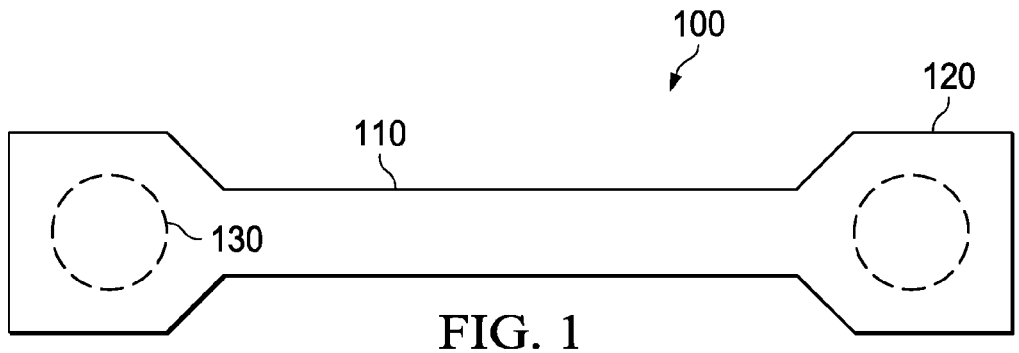
FIG. 1 illustrates a plan view of an example semiconductor resistor of the disclosure.

The embodiments herein describe modifying the resistance of a semiconducting resistor after fabrication of an electronic device by illuminating the resistor with light. The illumination heats a portion of the semiconductor resistor. The heat may cause melting or a solid state change of the morphology of the portion. The illumination may be chosen to cause the heated portion of a crystalline semiconductor to form an amorphous portion, or to cause a heated portion of an amorphous semiconductor to form a crystalline portion. Thus, the resistance of the resistor may be reversibly adjusted to a desired value. Such embodiments allow for reversible resistive tuning of circuits while in the active (operational) or inactive (non-operational) state. If desired, appropriate circuitry may be used to activate or deactivate redundant circuits in an electronic device in a similar manner as for fusible links.

Herein, allotrope refers to a form of an elemental or compound semiconductor determined by an arrangement of chemical bonds between atoms of the semiconductor. An allotropic state refers to the allotropic characteristic of a semiconductor region. More specifically, e.g., crystalline and amorphous forms of a semiconductor composition are different allotropic states of a semiconductor composition. Two semiconductors having different allotropic states also have a different morphology.

Herein, morphology of a semiconductor region refers to a structural form of that semiconductor region. The following semiconductor regions, for example, have different morphologies: a single-crystal region, an amorphous region, a first polycrystalline region having a first mean grain size, and a second polycrystalline region having a different second mean grain size. Herein, a first region and a second region have different mean grain sizes when the mean grain size of the first region differs by about 10% or more from the mean grain size of the second region.

In some cases, two semiconductor regions that have a same allotropic state have a different morphology. For example, two polycrystalline semiconductor regions having different mean grain sizes have the same allotropic state but a different morphology.

Herein, single-crystalline with respect to a resistive element or link means the resistive element or link is an extension of a lattice of an underlying crystalline semiconductor. Single-crystalline with respect to a region of a resistive link means that atoms of the semiconductor are part of a single crystal lattice in that region. Poly-crystalline with respect to a region of a resistive link means that that region comprises at least two crystal domains that are not regions of a single crystal. More specifically, the lattice axes of the crystal lattice of one crystal domain in a polycrystalline region are oriented arbitrarily with respect to axes of another crystal domain.

Semiconductors comprising, e.g., silicon, germanium, and gallium arsenide are known to exist in both crystalline and amorphous allotropic states. A semiconductor may be intrinsic or may include one or more dopants. In an intrinsic composition, impurities are either not electrically active or are present in a concentration at which no significant effect on the electrical properties of the semiconductor composition result from the presence of the impurities. In a doped semiconductor, the presence of the dopant may change the resistivity of the semiconductor. The resistivity of a doped semiconductor is typically lower than that of an intrinsic semiconductor.

A semiconducting resistor may be formed from a doped or an undoped semiconductor. The semiconductor resistor, may be unimorphic or polymorphic. A unimorphic resistor comprises only one morphology of the semiconductor, e.g., single crystalline or polycrystalline with an associated mean grain size. A polymorphic resistor comprises the semiconductor in two or more morphologies, e.g., single crystalline and poly-crystalline, or two polycrystalline regions with different mean grain sizes.

It is presently recognized that a resistive element formed from a crystalline semiconductor in a semiconductor device may be reversibly converted to an amorphous form without detrimental change of the molar volume of the semiconductor composition. The conversion is accompanied by minimal dimensional alteration of the original crystalline structures patterned into the device. The crystalline allotrope may be single-crystal or polycrystalline. Moreover, the amorphous allotrope may be converted to a polycrystalline allotrope having similar resistivity to the single-crystal or the original polycrystalline allotrope. The embodiments described herein provide a means to controllably and reversibly alter the resistance of the element to a desired value. In this manner, the resistive element may be tuned to achieve a desired operational characteristic of the semiconductor device.

In some cases the resistivity of the amorphous allotrope is at least about 100 times the resistivity of a crystalline allotrope of the semiconductor. In some embodiments described herein, the semiconductor composition comprises silicon. The resistivity of intrinsic crystalline silicon is about 0.23 MΩ-cm while that of amorphous silicon (a-Si) is on the order of about 100 MΩ-cm, a difference of over 400 times. Typically, a resistive element is formed as a single-crystal element or a polycrystalline element. Thus, for intrinsic silicon, e.g., the proportion of crystalline and amorphous silicon in a resistive element may be changed to result in a resistance value up to 400 times the resistance of the resistive element as fabricated. In general, the difference of resistance will be different for other semiconductors, and for doped semiconductors.

These observations lend themselves well to the adjustment of silicon-based resistors, e.g., that are formed in or over a semiconductor substrate, allowing for resistive tuning of circuits while in either an active or inactive state. For example, a diffusion resistor can be formed in a circuit on a single crystal silicon substrate that also contains other active and passive semiconductive elements. Upon completion and testing of the circuit, the diffusion resistor can be tuned to higher resistance values. If the resistor is tuned while the circuit is operating, the resistor may be tuned dynamically using an operating characteristic of the circuit as a tuning parameter.

As discussed in greater detail below, the morphology of the resistor may be changed by illuminating a portion of a resistor with a light source of a predetermined wavelength or range of wavelengths and a predetermined power for a selected duration, or for a specified number of pulses of a selected duration. In some embodiments, the light source is external to the semiconductor device comprising the resistor. In some embodiments, the light source is integrated with the die or with a package in which the die is placed as part of a "system on a chip."

Turning initially to FIG. 1, a plan view of a resistive element formed according to the disclosure is shown and generally designated 100. The resistive element 100 is shown without limitation as a resistor with a "dumbbell" structure. Other resistive elements may include, e.g., distributed R-C or L-C elements having a structural layout designed to provide a particular capacitance or inductance. The resistive element 100 includes a resistive link 110 and conventional connecting portions 120. The connecting portions 120 are shown without limitation as contact landing pads for contacts 130, e.g., but may include other interconnect elements useful in a particular design to provide access to the resistive link 110. Such other elements include, without limitation, inter-level vias, polysilicon lines, metal lines, and tungsten contacts.

Figure 2:
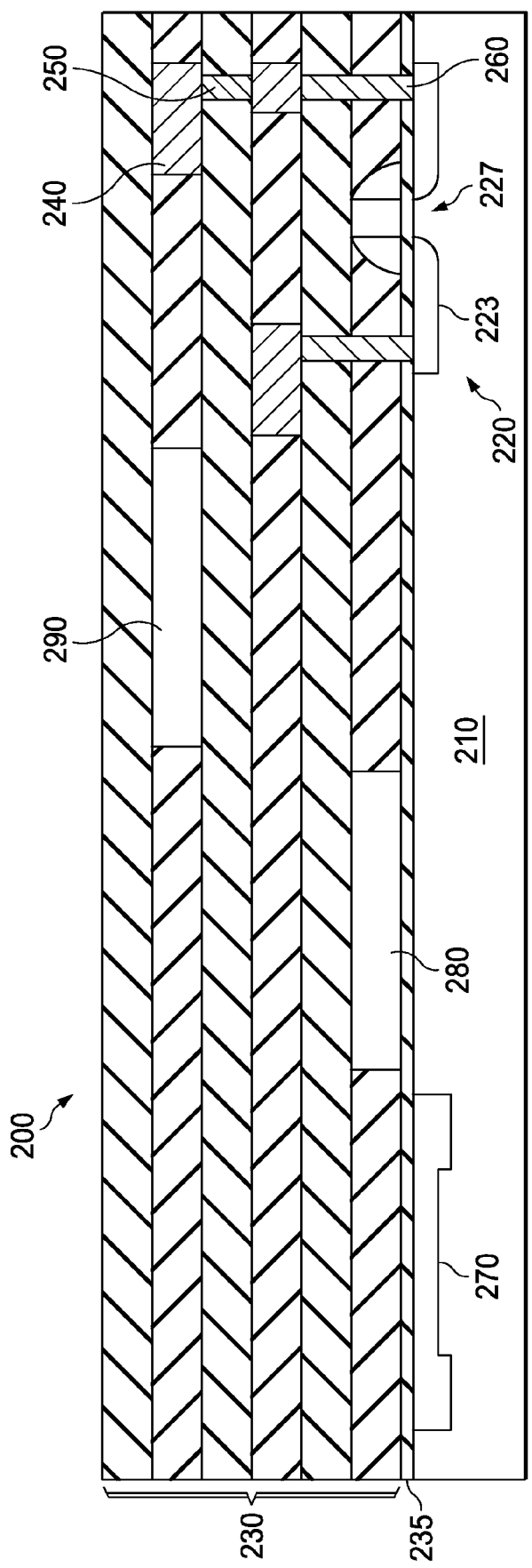
FIG. 2 illustrates a sectional view of a semiconductor device formed according to the disclosure.

FIG. 2 illustrates a sectional view of an example semiconductor device 200. The semiconductor device 200 includes a substrate 210. The substrate 210 may include any semiconducting material on which an electronic device may be formed, including without limitation silicon, germanium, gallium arsenide (GaAs), carbon, germanium, silicon carbide, silicon germanium, gallium phosphide, and gallium nitride. The substrate 210 may be formed as, e.g., a homogeneous substrate (e.g., a wafer), a silicon-on-insulator (SOI) layer or an epitaxial layer. Such substrates typically include a single-crystalline surface layer and may be doped to impart a desired resistivity to all or a portion of the substrate 210. The substrate may include a transistor 220, illustrated without limitation as a MOS transistor. The transistor 220 includes source/drain regions 223 and a gate structure 227. Conventional dielectric layers 230 and a conventional gate dielectric layer 235 are formed over the substrate 210, and may include metal interconnects 240, vias 250 and contacts 260.

The semiconductor device 200 may include one or more of resistive elements 270, 280, 290 here shown as resistors, e.g., and formed according to the disclosure. The resistive element 270 is formed in the substrate 210 and may be, e.g., a diffusion resistor. The resistive elements 280, 290 are formed of a layer of a semiconducting composition overlying the substrate 210. The overlying semiconducting composition may be the same or a different semiconducting composition as the underlying substrate 210. For example, the resistive element 280 may be formed of a polysilicon layer, while the substrate 210 may be GaAs. The resistive element 280 may be formed, e.g., in a layer from which a gate of the transistor 220 is formed. The resistive element 290 may be formed, e.g., from a semiconducting layer formed in an interconnect level of the semiconductor device 200. Without limitation, the resistive elements 280, 290 may be formed from, e.g., polysilicon.

Turning now to FIGS. 3A and 3B, illustrated are a plan and a sectional view, respectively, of a resistive link 310 of the resistive element 270 after at least partially forming the semiconductor device 200. The resistive link 310 may be all or a portion of that part of the resistive element 270 configured to provide a predetermined resistance thereof. In some embodiments, the resistive link 310 includes a dopant that is implanted and diffused to impart a desired resistivity thereto. Because the resistive link 310 is a portion of a diffusion resistor, the resistive link 310 is initially a single crystal, and is an extension of the lattice of the substrate 210.

The resistance of the resistive link 310 is generally a function of the resistivity of the semiconductor composition (here, the substrate 210 modified by any doping) and the geometry of the resistive link 310. The resistivity ρ of intrinsic silicon, e.g., is about 0.23 MΩ-cm. A resistive link with, e.g., a rectangular cross-sectional area A in a direction of current flow will have a resistance about equal to ρ*l/A, where l is the length of the resistive link in the direction of current flow.

Figure 3C:
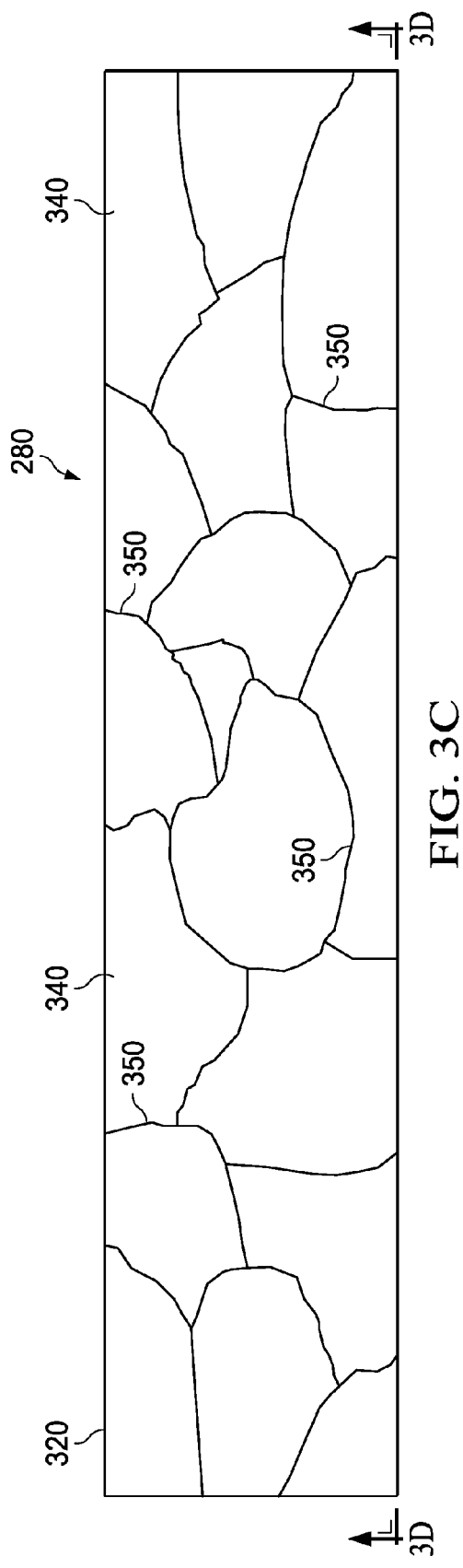
FIGS. 3C and 3D illustrate plan and sectional views, respectively, of a resistive link formed from a polycrystalline semiconductor at a gate electrode level.
Figure 3D:
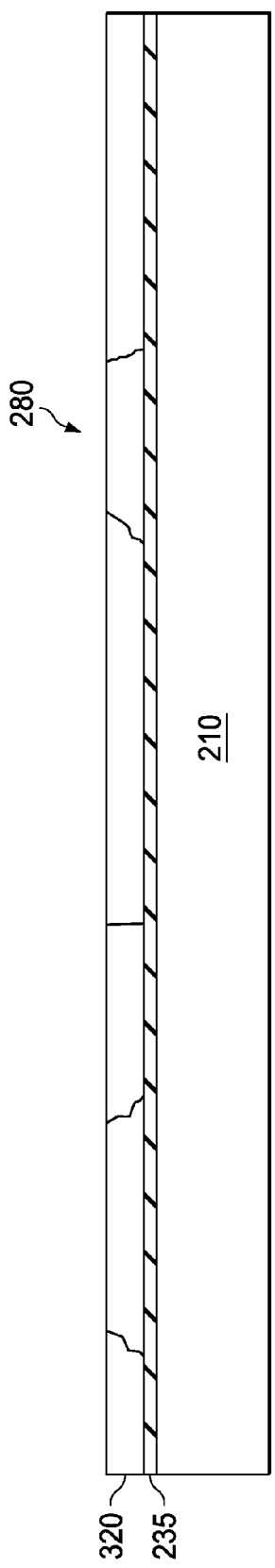

FIGS. 3C and 3D illustrate a plan and a sectional view, respectively, of a resistive link 320 of the resistive element 280 formed over the substrate 210. The dielectric layer 235 insulates the resistive link 320 from the substrate 210. The resistive link 320 has a polycrystalline morphology, and includes crystal grains 340 separated by grain boundaries 350. The crystal grains 340 have an arbitrary lattice orientation with respect to the substrate 210. In some embodiments, the resistive link 320 is formed from polysilicon. The resistive link 320 may be intrinsic, or may include a dopant selected to impart a desired resistivity thereto. The resistivity of the polycrystalline resistive link 320 will generally be about the same as the resistivity of a single crystal semiconductor having the same composition.

Figure 3E:
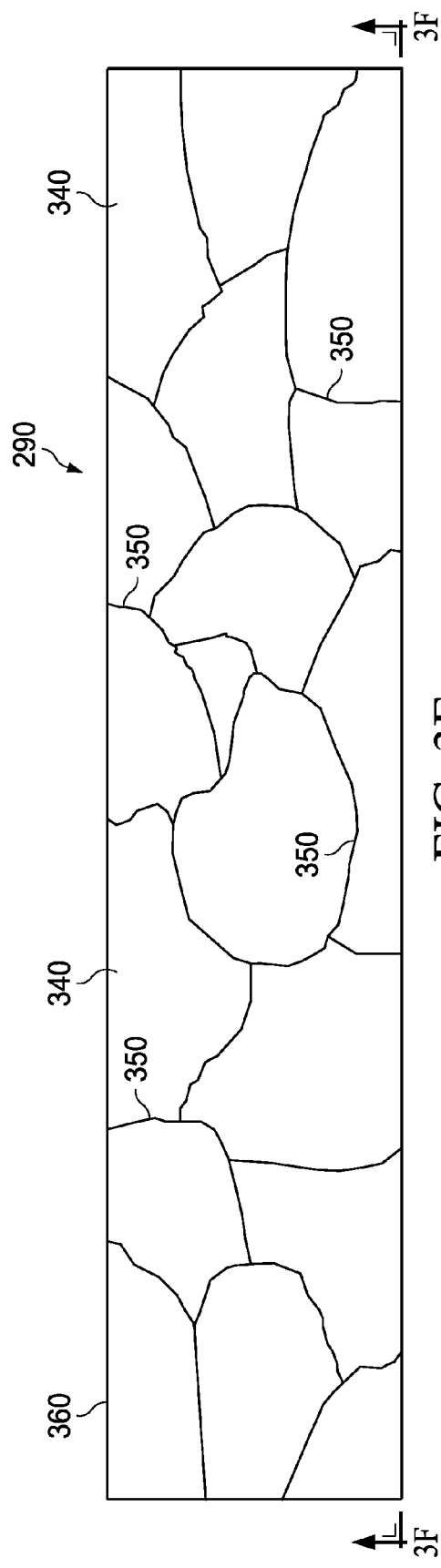
FIGS. 3E and 3F illustrate plan and sectional views, respectively, of a resistive link formed from a polycrystalline semiconductor at an interconnect level.
Figure 3F:
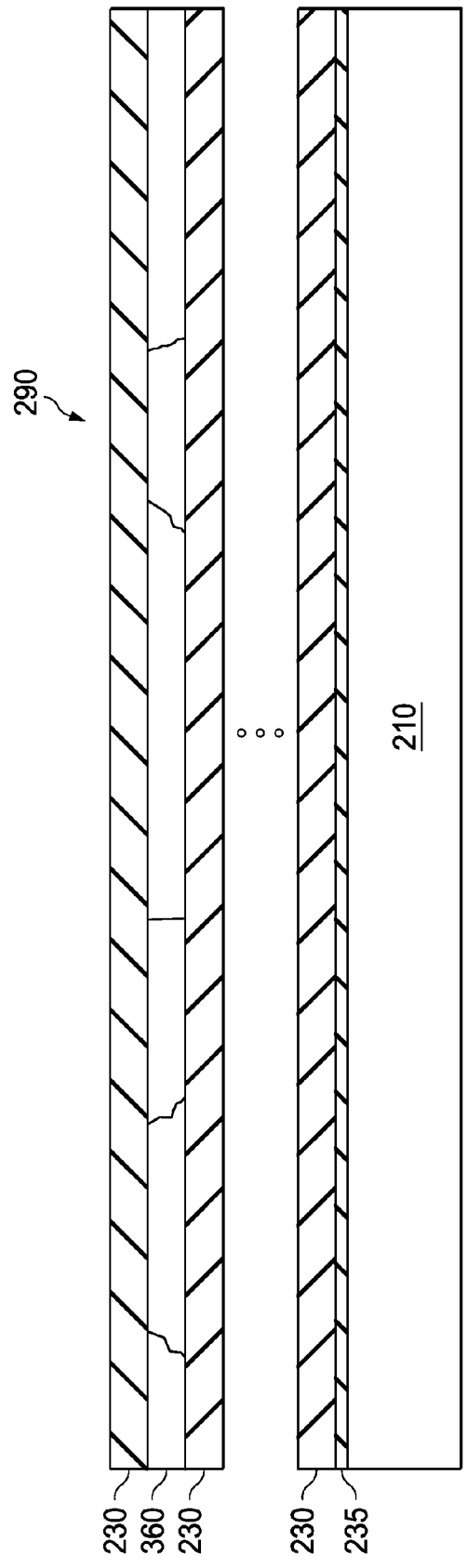

FIGS. 3E and 3F illustrate a plan and a sectional view, respectively, of a resistive link 360 of the resistive element 290 formed over the substrate 210. The resistive link 360 is located with a number of dielectric layers 230 above and below, reflecting the fact that the resistive link 360 is formed at an interconnect level of the semiconductor device 200. As was described for the resistive link 320, the resistive link 360 includes crystal grains 340 separated by grain boundaries 350, and may be formed from, e.g., polysilicon.

Figure 4A:
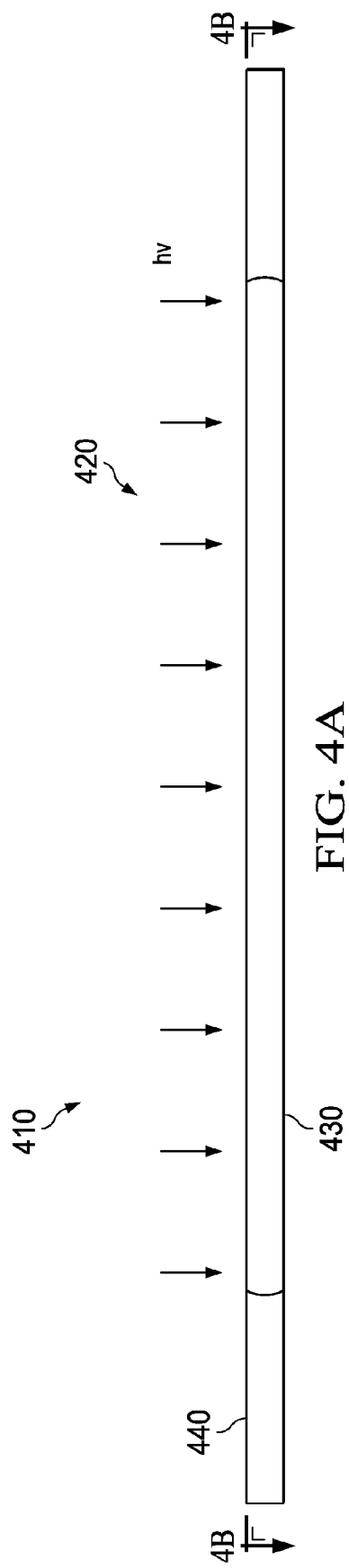
FIGS. 4A through 4D illustrate conversion of a portion of a resistive link from a crystalline allotropic state to an amorphous allotropic state.

Turning now to FIG. 4A, illustrated is a plan view of the resistive link 310 as exposed to an illumination process 410. As used herein, an illumination process refers to a set of conditions characterizing the illumination of a resistive link, including, e.g., a spot size. The illumination process 410 illuminates some or all of the resistive link 310, as determined by the relative sizes of the illumination spot and the resistive link 310, and the alignment of the spot to the resistive link 310. In the illustrated embodiment, some but not all of the resistive link 310 is illuminated.

The illumination process 410 is configured to deliver a power density (e.g., W/µm$^2$) to the resistive link 310 that is sufficient to heat a region 420 thereof. The heating may melt the region 420 or cause a solid-state transformation from one morphology to another, different morphology. As described more fully below, an illumination process may include, e.g., a combination of the power density of the illumination spot, and the on-time, the duty cycle and the wavelength of the light source.

Figure 4B:
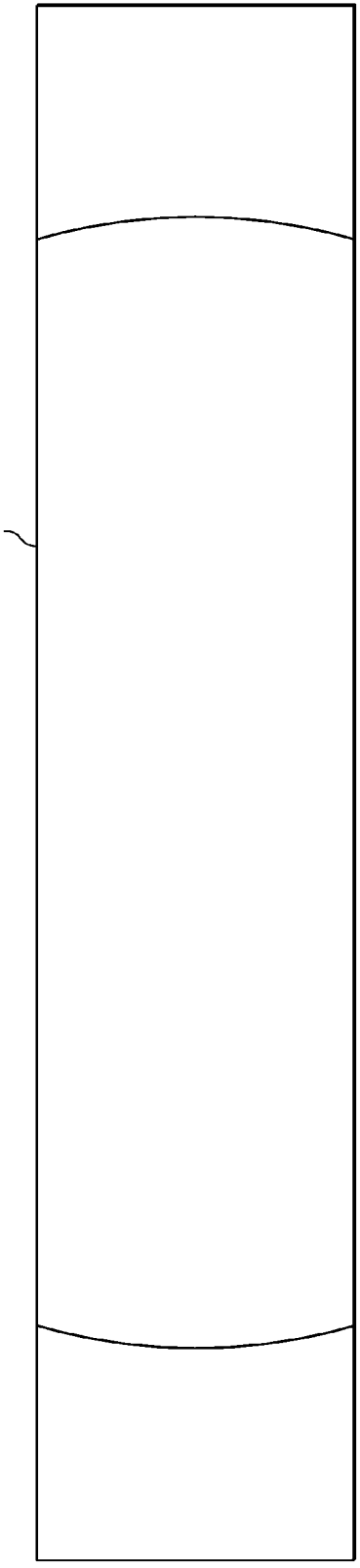

The illumination process 410 may include a subprocess designed to heat the desired portion of the resistive link 310, which may be followed by a subprocess designed to allow the heated portion to cool with a desired time-temperature characteristic. Among other parameters, the time-temperature characteristic may take into account the thermal conductivity of the various structural features of the semiconductor device 200 of which the resistive link 310 is a part, and the total power deposited into the resistive link 310 and those features. In the embodiment illustrated in FIGS. 4A and 4B, the exposure conditions are chosen such that the heated portion is cooled quickly enough that at least some of the heated region 420 forms an amorphous allotrope of the semiconductor. Thus, the resistivity of the region 420 increases from that associated with the crystalline semiconductor to the resistivity associated with the amorphous allotrope of the semiconducting composition. The region 420, which is amorphous, constitutes a first resistive region of the resistive link 400.

A region 430 was not sufficiently heated by the illumination process 410, remains crystalline, and retains the resistivity associated with the crystalline semiconductor. The amorphous semiconducting composition, e.g., the region 420, has a greater resistivity than the crystalline semiconductor composition, e.g., about 100 MΩ-cm for silicon. Thus, the region 420 has a greater resistivity than the region 430, and the resulting resistance of the resistive link 400 is increased by the illumination process 410. By configuring the illumination process 410 to convert a desired portion of the resistive link 400 to the amorphous allotrope, the resistance of resistive link 400 can be adjusted between a minimum determined in part by the resistivity of the crystalline allotrope and a maximum determined in part by the resistivity of the amorphous allotrope.

Figure 4C:
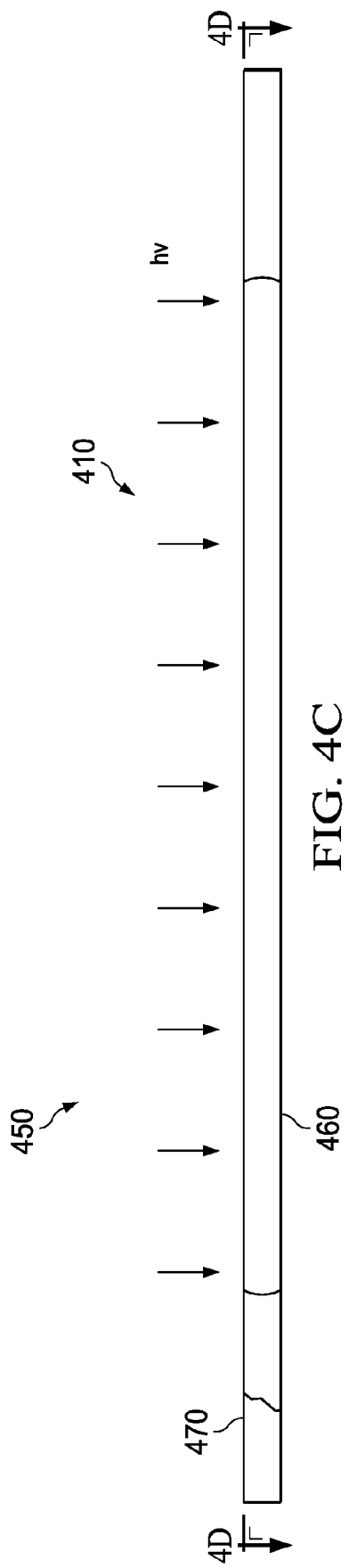
Figure 4D:
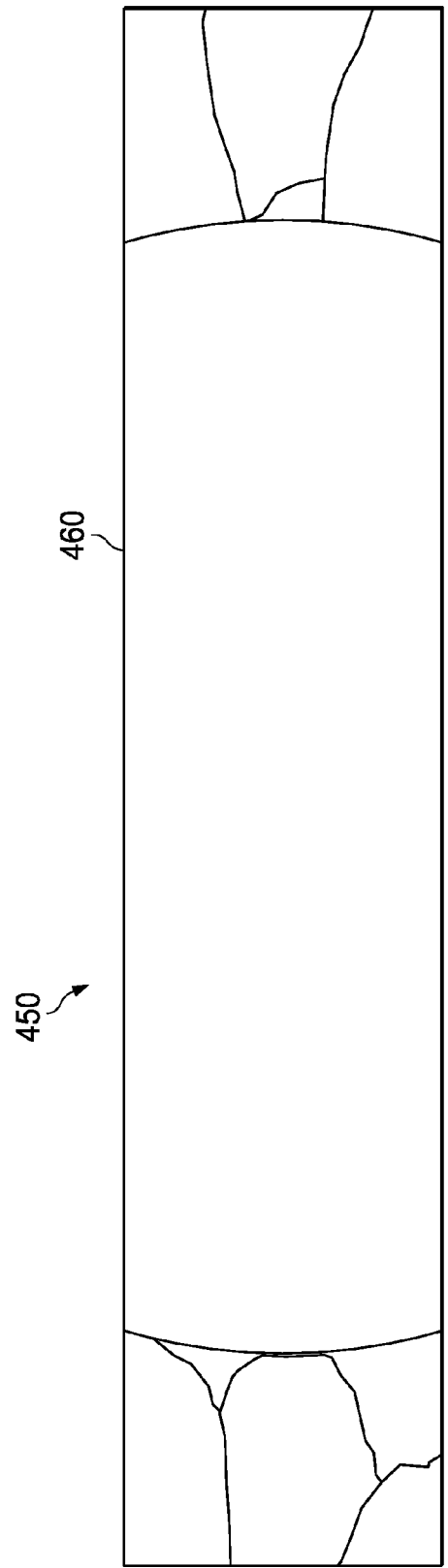

FIGS. 4C and 4D illustrate an embodiment in which the resistive link 320, initially polycrystalline, is exposed to the illumination process 410. In a manner analogous to the embodiment of FIGS. 4A and 4B, a portion of the resistive link 320 is heated and cooled, resulting in an amorphous region 460 that is a first resistive region, and a polycrystalline region 470 that is a second resistive region. The resistance of the resistive link 450 is thus increased by the conversion of the region 460 from the polycrystalline allotrope to the amorphous allotrope. The foregoing discussion also applies to the resistive link 360.

Figure 5A:
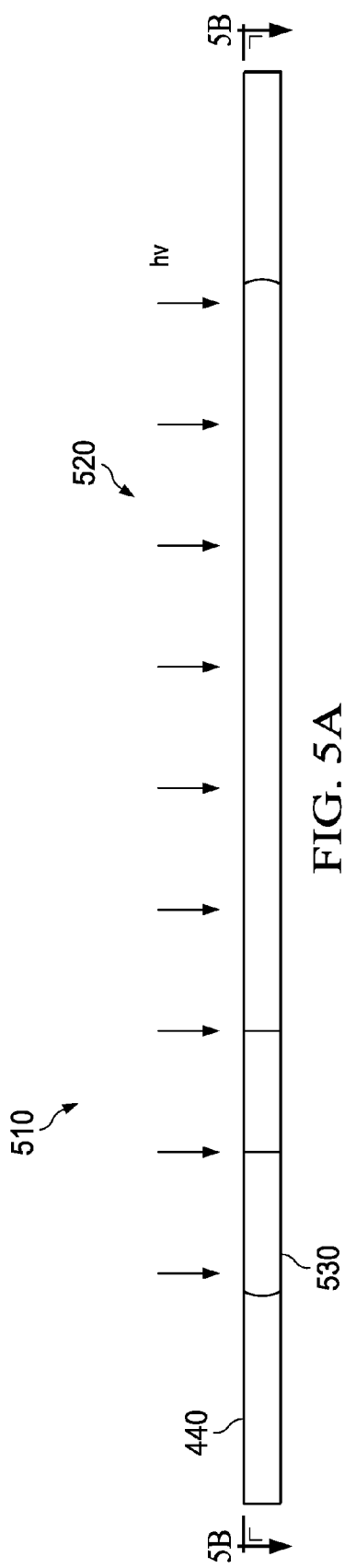
FIGS. 5A through 5D illustrate conversion of a portion of a resistive link from an amorphous allotropic state to a crystalline allotropic state.
Figure 5B:
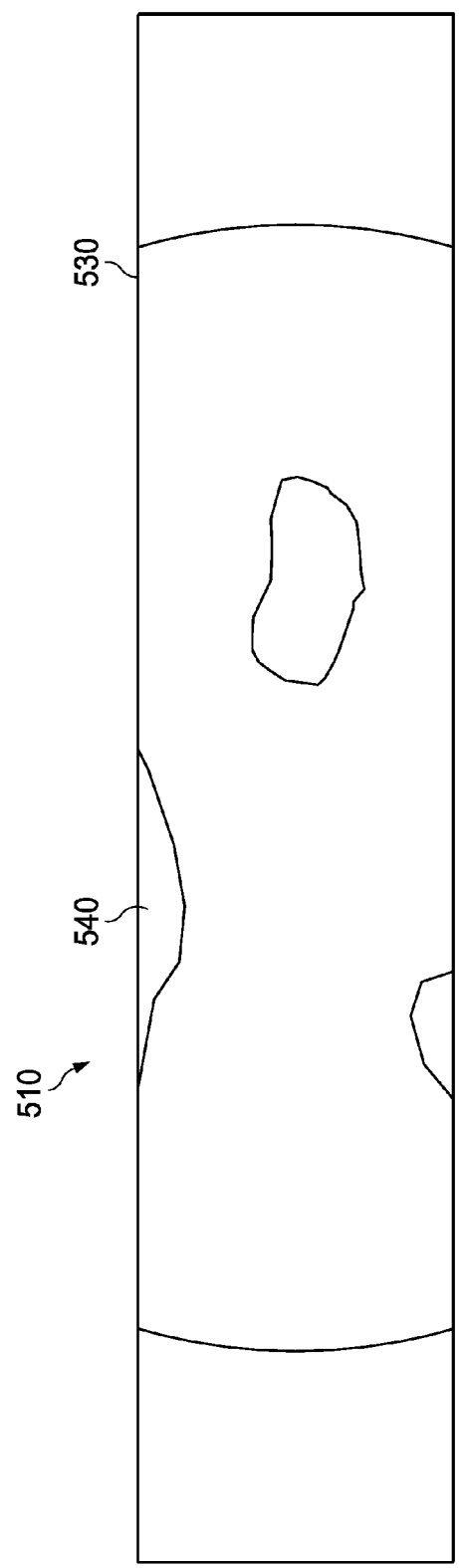

Turning to FIGS. 5A and 5B, illustrated is an embodiment in which a portion of the resistive link 310 is converted from an amorphous allotrope to a crystalline allotrope. An illumination process 510 illuminates a portion of the resistive link 310, previously converted to an amorphous allotrope, causing at least part of the illuminated portion to melt and subsequently crystallize, or to undergo a solid-state transition from amorphous to polycrystalline. The illumination process 510 will generally provide a different illumination profile than the illumination process 410. As before, the exposure conditions are chosen such that the temperature of the illuminated portion decreases with a predetermined time-temperature characteristic. However, in contrast to the cooling of the portions 420, 460, the illuminated portion is cooled slowly enough that a polycrystalline portion 520 forms.

The region 430 of the resistive link 310 remains unaltered by the illumination process 510, and substantially retains the resistivity of the single-crystal semiconducting composition. Because both portions 430, 520 are crystalline, the resistivity of the region 430 is about equal to the resistivity of the portion 520. Moreover, because the resistivity of the crystalline semiconductor is typically lower than the resistivity of the amorphous semiconductor, the resistance of the resistive link 310 is reduced by the illumination process 510. While the resistivity of the portion 520 may be somewhat higher due to grain boundary resistance, this effect is thought to be small enough to be neglected in some cases. For example, the resistivity of the portion 520 is expected to be about equal to that of region 430 when the diameter of the grains in the portion 520 is about 1 µm or larger. However, in cases where the grain diameter is on the order of one nanometer or smaller, the resistivity of the portion 520 is expected to be significantly greater than that of the region 430.

In FIG. 5B, amorphous portions 530 are illustrated. The portions 530 may result, e.g., from either incomplete melting of the illuminated region of the resistive link 310 or from nonuniform cooling of the semiconducting composition. When present, the portions 530 may be an artifact of the crystallization process, or may be an intentional result of the time-temperature profile determined to result in a desired resistance of the resistive link 310. If such amorphous portions are present, the resistance of the resistive link 310 will be a function of the relative contribution of the crystalline region 430, the polycrystalline portion 520 and the amorphous portions 530.

Figure 5C:
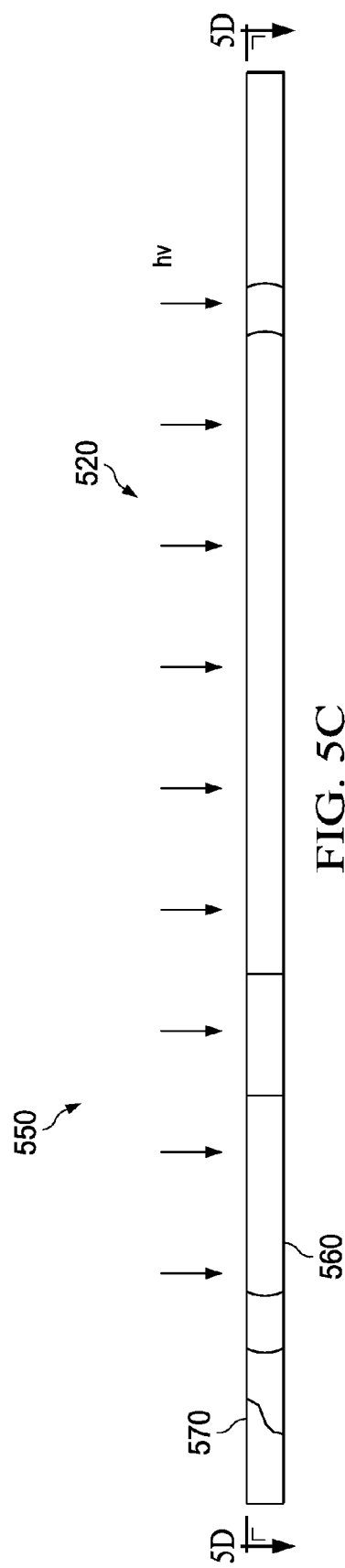
Figure 5D:
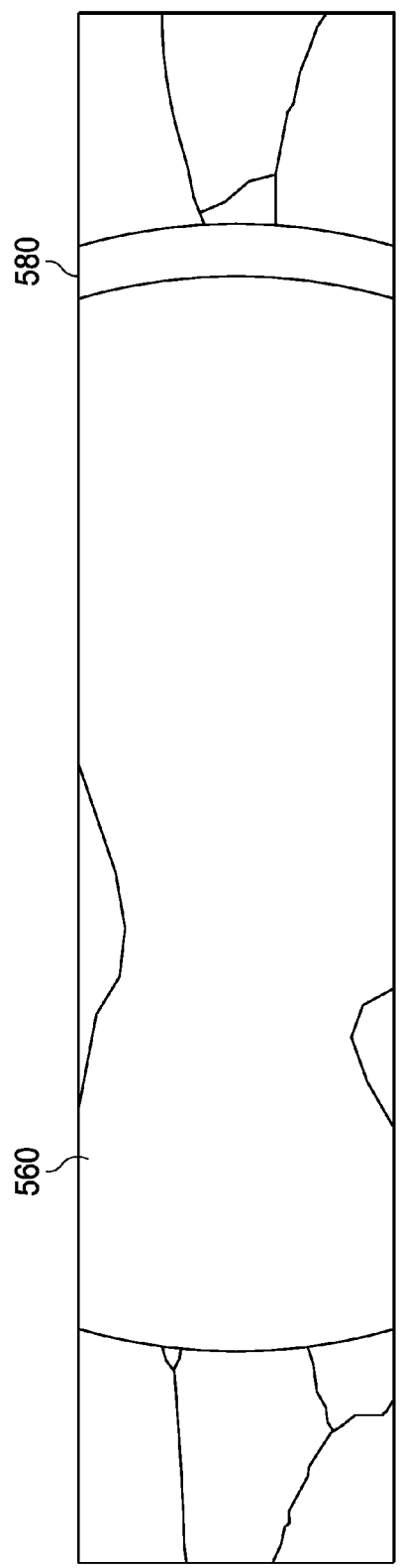

Turning now to FIGS. 5C and 5D, an embodiment is illustrated in which the resistance of the resistive link 320 is reduced by the illumination process 510 heating a portion thereof. A region of the resistive link 320 is illuminated by the illumination process 510 in a manner analogous to that described with respect to the embodiment of FIGS. 5A and 5B. A portion 560 is thereby converted from an amorphous allotrope to a polycrystalline allotrope, reducing the resistance of the resistive link 320. A polycrystalline portion 570 is substantially unaltered by the illumination of the resistive link 320 by the illumination process 410 or the illumination process 510.

In the embodiment of FIGS. 5C and 5D, however, a portion 580 remains amorphous because the illumination process 510 was misaligned with the portion of the resistive link 320 converted to the amorphous allotrope by the illumination process 410. Such misalignment may be an artifact of alignment tolerances from one illumination process to another, or may be intentionally introduced to result in a desired distribution of crystalline and amorphous allotropes of the semiconducting composition.

In general, the mean size of crystal grains in the portion 560 will be different from the grains in the portion 570, because the two portions are crystallized under different conditions. For example, a slower rate of cooling of the semiconductor composition is generally associated with larger crystal grains, while a faster rate of cooling is generally associated with smaller grains. In some cases, as described further below, the mean grain size of the portion 560 is less than that of the portion 570. The morphology of the portion 560 is deemed different from that of the portion 570 when the mean grain size of the portions 560, 570 differ by greater than about 10%. In some embodiments, the mean grain size of the portion 560 is less than about 50% of the grain size of the portion 570. Under some conditions, including a sufficiently large rate of cooling, the mean grain size of the portion 560 is less than about 10% of the grain size of the portion 570. With a greater rate of cooling, a mean grain size of the portion 560 of less than about 1% that of the portion 570 may be achieved. With an even greater rate of cooling a mean grain size less than 0.1% that of the portion 570 is possible.

Turning to FIG. 6A, illustrated is a nonlimiting embodiment of an illumination process 610 configured to convert a portion of a resistive link 620 from a first morphology to a different second morphology. In some embodiments, the illumination process 610 converts a portion of the resistive link 620 from a first allotrope to a different second allotrope, such as crystalline to amorphous or vice versa. A light source 630 may be any source of visible or invisible electromagnetic radiation that may be focused to provide a sufficient power density to heat the semiconductor to result in a change of morphology. In some cases, a laser is used for the light source 630, as such sources are widely available and have been integrated into semiconductor processing for other purposes. The light source 630 also may be configured to provide a wavelength of light to which overlying layers 230 of the semiconductor device 200 are at least partially transparent. The wavelength of light may be further selected to be substantially absorbed by the resistive link 620. Herein, substantially absorbed means at least about 50% of the power incident on the resistive link 620 is converted to heat in the immediate vicinity of the resistive link 620.

The light source 630 is associated with optics 640 to focus a light beam 650 to a spot on the resistive link 620. An optical axis 660 is provided for reference, and projects from the light source 630 to a focal plane 670 of the optics 640. In the illustrated embodiment, the focal plane is coincident with the resistive link 620. The light source 630 has a direct line of sight to the resistive link 620. In other embodiments, mirror surfaces or "light pipes" are used to direct the radiation to the resistive feature to be modified.

In some cases, the source is a high intensity source of electromagnetic radiation. Herein, high intensity means that the source is capable of delivering at least about 1E-6 W in an area (spot size) about 1 $mm^2$ or smaller. In some cases, the spot size is about 1E4 $\mu m^2$ or less. The spot may be as small as the wavelength of the light and the precision of the optics 640 allow, e.g., on the order of about 1 $\mu m^2$ for a coherent source. In a nonlimiting example, a laser with a beam power of 1 E-3 W, and a power density ranging from about 8 E-3 W/$\mu m^2$ to about 1.4 E-2 W/$\mu m^2$ may be produced at the focal plane 670. Such a beam may be provided, e.g., by a Micropoint Laser system, manufactured by Photonic Industries, St. Charles, Ill. In other cases, the source is a source of incoherent electromagnetic radiation, such as, e.g., a xenon arc lamp with focusing optics or optical fiber to produce a desired spot size.

As described previously, various illumination parameters may be varied to produce a desired illumination process, including the total power of the light source 630, the power density of the illumination spot, the on-time and the duty cycle. The power density of the illumination spot may be varied in various embodiments. In some cases, the power output by the light source 630 is altered. In other cases, the position of the focal plane 670 is changed in relation to the resistive link 620.

FIG. 6B illustrates one example of the latter embodiment, in which the focal plane 670 is located above the resistive link 620. In other embodiments, the focal plane may be located below the resistive link 620. In either case, the power of the light source 630 is distributed over a larger area of the resistive link 620, reducing the power density relative to the case in which the focal plane 670 is coincident with the resistive link 620. Moreover, transmittance of the dielectric layers 230 will not generally be unity, so a portion of the power of the light beam 650 will typically be deposited into these layers. A maximum power density is produced at the focal plane 670. Thus, a region 680 will be heated to a greater extent than regions further from the focal plane 670.

The resistive link 620 may also be translated laterally with respect to the optical axis 660. In this manner, the light beam 650 may be scanned across the resistive link 620 in a manner designed to convert a desired portion of the resistive link 620 from one morphology to another morphology.

By scanning the light beam 650 and varying the distance between the focal plane 670 and the resistive link 620, a desired temperature profile may be produced in the resistive link 620 that results in the desired time-temperature characteristic of the illumination process 610. In general these parameters and the parameters discussed above (e.g., light source power, wavelength, power density at the focal plane, pulse duration, number of pulses and duty cycle) will need to be determined for a specific combination of semiconductor device architecture and resistive link.

Figure 7:
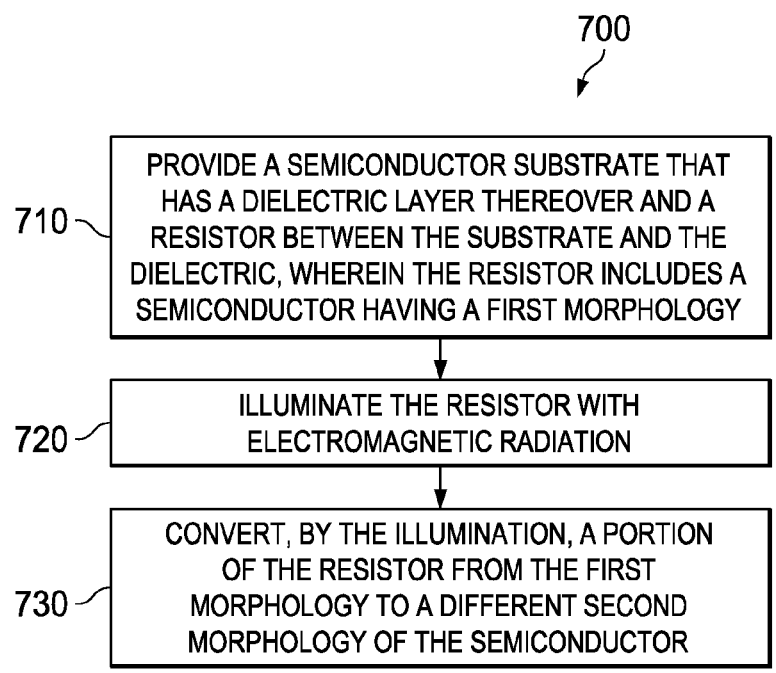
FIG. 7 illustrates a method of the disclosure.

Turning now to FIG. 7, a method generally designated 700 is illustrated that may be employed in manufacturing a semiconductor device. In a step 710, a semiconductor substrate is provided that has a semiconductor resistor formed thereover. An interconnect dielectric layer is either present as the substrate is provided, or the dielectric layer is formed after receiving the substrate. As used herein, "providing" includes, without limitation, 1) manufacturing the substrate and interconnect dielectric layer in the local manufacturing environment in which subsequent steps in the method 700 are performed, and 2) receiving the substrate with or without an interconnect dielectric layer formed thereover from a source external to the local manufacturing environment. The resistor comprises a semiconductor having a first morphology. In a step 720, light is directed onto the resistor. In a step 730, a portion of the resistor is converted by the illumination from the first morphology to a different second morphology of the semiconductor.

As a nonlimiting example, an experiment was performed in which a laser source was used to heat each of four diffusion resistors formed in a silicon substrate and having about 7 µm of dielectric formed thereover, including $SiO_2$ and SiN layers.

Figure 8:
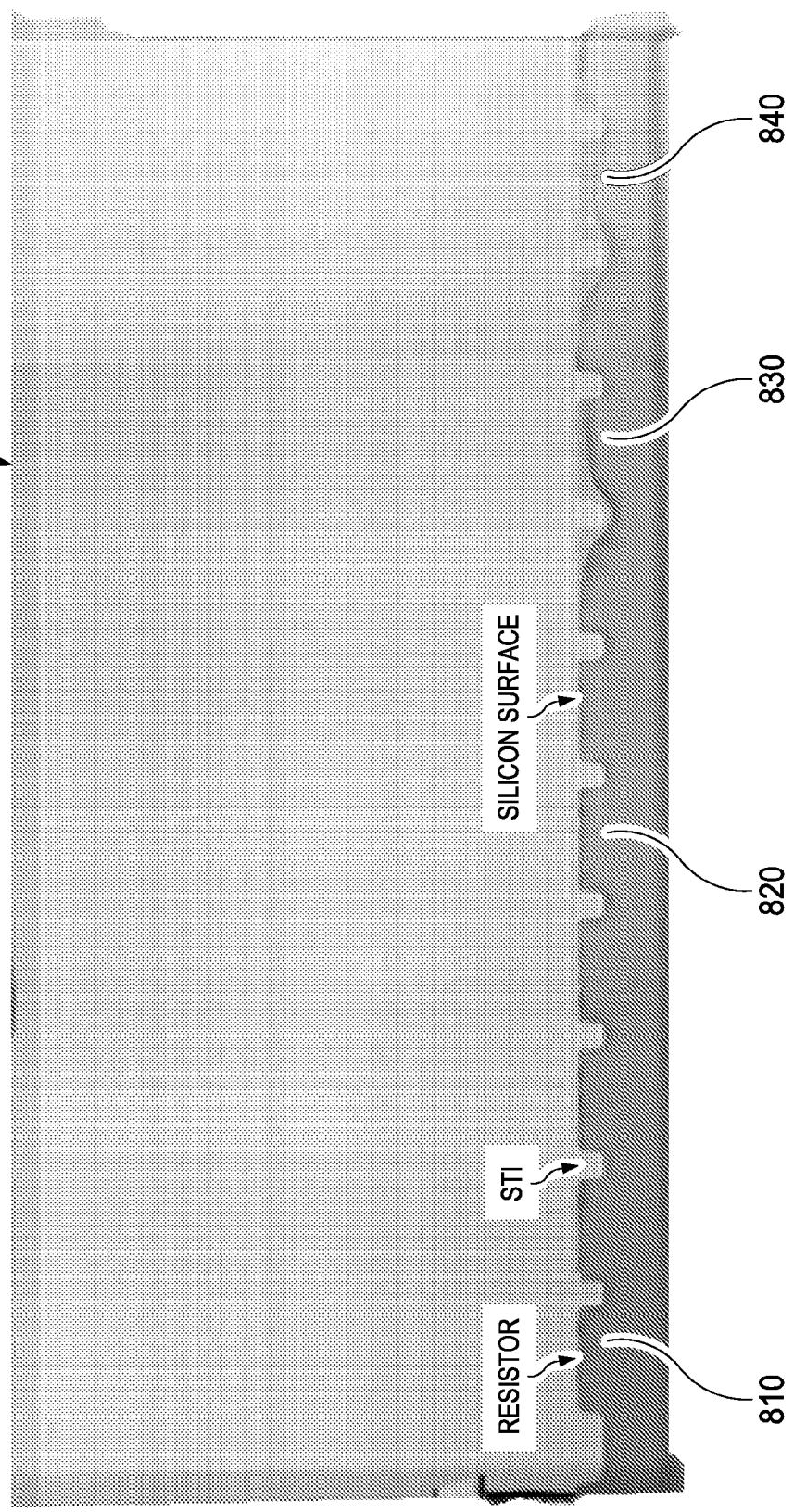
FIGS. 8-12 illustrate experimental results of converting a resistive link from one to another allotropic state by illumination with a light source.

FIG. 8 presents a cross-sectional scanning transmission electron micrograph (STEM) of the four tested structures. Resistors 810, 820, 830, 840 were illuminated by a 435 nm laser source operating with an output power of about 0.6 mW, and the beam focused to a 0.3 µm spot size. Resistors 810, 820 were illuminated with the beam focused at the dielectric surface, and resistors 830, 840 were illuminated with the beam focused at the silicon surface. Resistors 810, 830 received a single 5 ns pulse, while resistors 820, 840 received four 5 ns pulses spaced 1 s apart.

Figure 9:
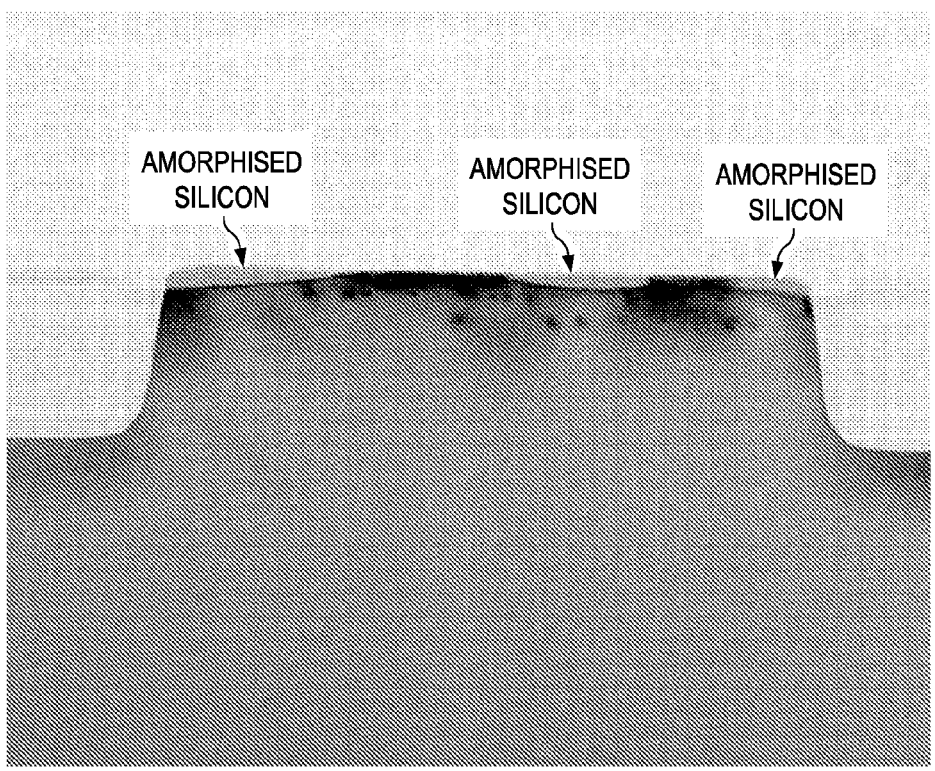

FIG. 9 shows a higher magnification view of the resistor 810 after illumination by a single laser pulse focused on the dielectric surface. Three discontinuous regions of amorphous silicon are apparent. It is believed that this result indicates that the temperature of the silicon at the surface of the resistor 810 was sufficient to melt the silicon. It is thought that the temperature of the silicon dropped rapidly enough to quench the molten silicon, resulting in the amorphous regions.

Figure 10:
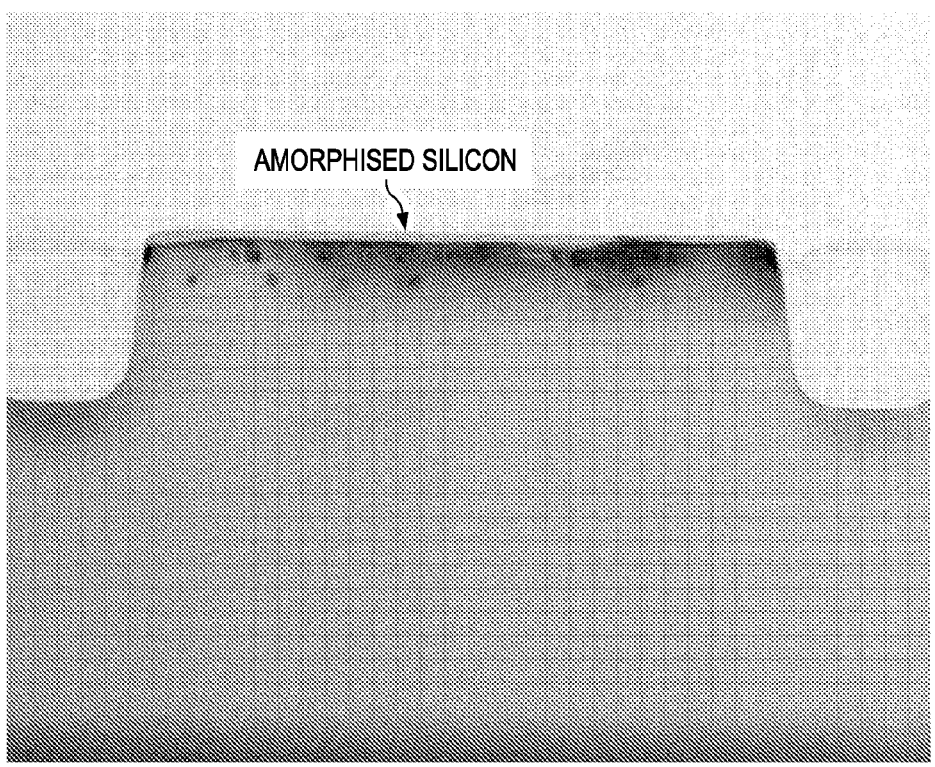

FIG. 10 shows a higher magnification view of the resistor 820 after illumination by four laser pulses focused on the dielectric surface. A single amorphous region is observed spanning the entire resistor. It is believed that the larger amorphous region indicates that the multiple pulses delivered enough energy to the silicon at the surface of the resistor 820 to result in more complete or more extensive melting of the silicon. Again, the temperature after illumination is thought to have dropped quickly enough to quench the molten silicon into an amorphous state.

Figure 11:
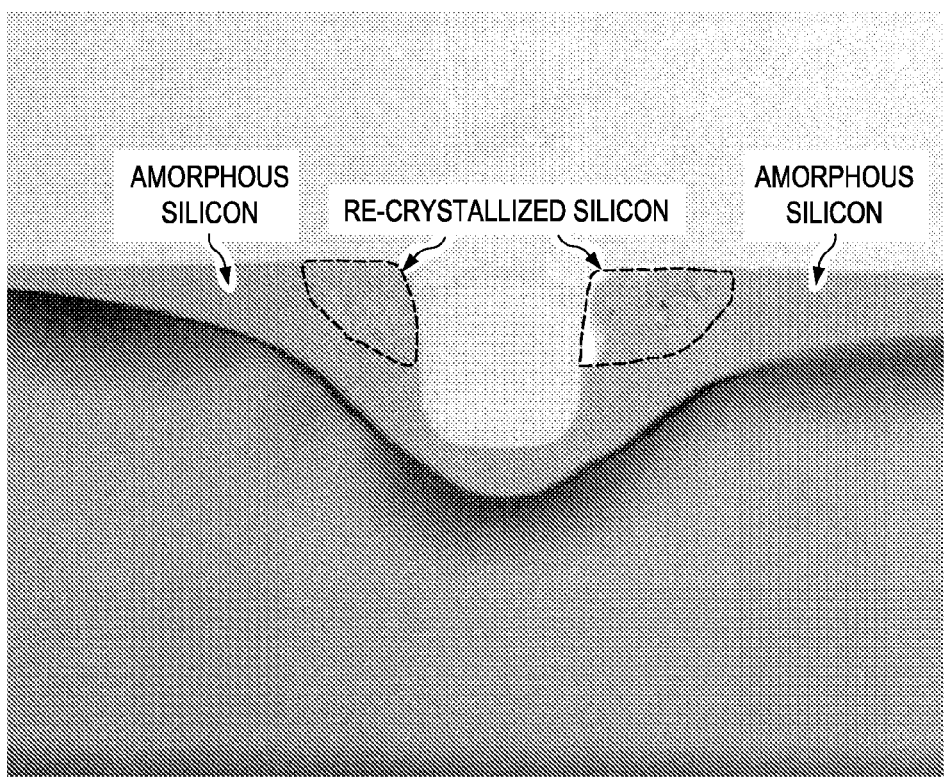

FIG. 11 shows a higher magnification view of the resistor 830 after illumination by a single laser pulse focused on the silicon surface. The laser spot was misaligned with the resistor 830 in this case, but the misalignment does not prevent interpretation of the results. Two regions of altered silicon are seen. A broad area of amorphous silicon is seen underlying a smaller area of recrystallized silicon. It is thought that in this case, a greater amount of energy was deposited into the surface of the resistor 830, causing a greater degree of melting. The silicon substrate is thought to have conducted heat from the molten silicon closer to the substrate rapidly enough to quench the silicon in the amorphous state. The recrystallized silicon is thought to have cooled more slowly because this region was insulated from the substrate by the amorphous region, and the thermal conductivity of the dielectric adjacent and above the recrystallized silicon is lower than that of the silicon substrate.

Figure 12:
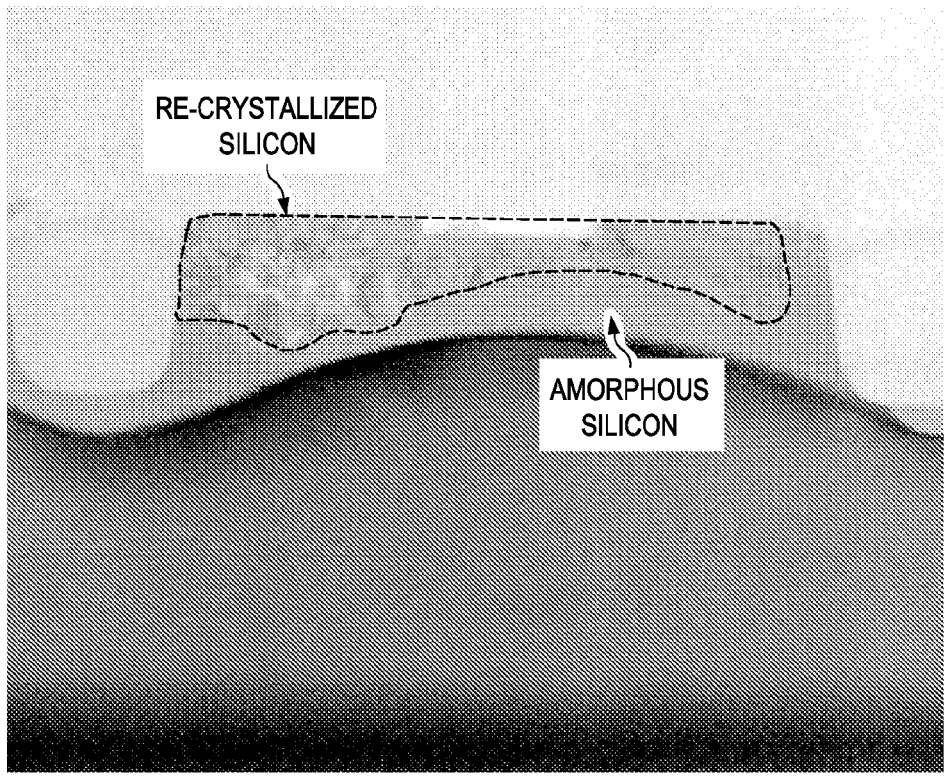

FIG. 12 shows a higher magnification view of the resistor 840 after illumination by four laser pulses focused on the silicon surface. Again, an amorphous region and a recrystallized region are observed. In this case, the recrystallized region is larger in area and penetrates deeper into the resistor 840. It is thought that this result indicates that the substrate was sufficiently heated to cause more extensive melting of the silicon and to heat the underlying unmelted substrate to a greater extent. The heated substrate is thought to have slowed the cooling of the molten silicon to allow greater recrystallization of the molten portion.

Significantly, no damage to the overlying dielectric is observed in FIGS. 9-12. This lack of damage indicates that any dimensional change in the resistors 810-840 due to melting and changing the allotrope of the silicon therein was insufficient to cause mechanical damage to the resistor or the overlying dielectric.

Taken together, several conclusions are drawn from the results illustrated in FIGS. 8-12: 1) laser energy may be used to heat a portion of the silicon substrate without damaging the overlying dielectric; 2) a greater number of laser pulses results in a greater conversion of melting of the silicon from one morphology to another morphology; 3) focusing the laser pulse at the surface of the dielectric provides sufficient energy to melt a portion of the silicon, but allows the melted portion to quench to form an amorphous region; and 4) focusing the laser pulse at the silicon surface heats the substrate to a sufficient extent that a portion of the melted silicon cools slowly enough to allow recrystallization of that portion.

These results and conclusions provide the basis for reversible adjustment (trimming) of the resistance of semiconductor resistive elements. For example, the resistance of a resistive element may be increased by converting a portion of the resistive element from a crystalline allotrope to an amorphous allotrope, as exemplified by FIGS. 9 and 10. The resistance may then be reduced by converting some or the entire amorphous portion to a crystalline allotrope, as exemplified by FIGS. 11 and 12.

These observations lend themselves well to the adjustment of semiconductor-based resistors that are built into or over a semiconductor substrate, allowing for the resistive tuning of circuits while in either the active (operational) or inactive (non-operational) state. For example, a diffusion resistor can be built into a circuit on a single crystal silicon substrate that also contains other active and passive semiconducting elements. Upon completion and testing of the circuit, the diffusion resistor can be tuned to higher resistance values by use of an appropriately designed illumination process. Such a process may be determined in individual cases by, e.g., a designed experiment (DOE) protocol. When desired, the semiconductor-based resistor may be made part of a portion of an electronic device that provides similar functionality to a fusible link, e.g., enabling or disabling redundant circuits of the electronic device.

Although the present invention has been described in detail, those skilled in the art should understand that they can make various changes, substitutions and alterations herein without departing from the spirit and scope of the invention in its broadest form.

What is claimed is:

1. An electronic device, comprising:
   a substrate;
   a dielectric layer over said substrate; and
   a resistive link located between said substrate and said dielectric layer, said resistive link comprising a silicon semiconductor layer having a first resistive region and a second resistive region, said first resistive region having a first resistivity and a first morphology, and said second resistive region having a second resistivity and a different second morphology and wherein said first resistive region has a first allotropic state and said second resistive region has a different second allotropic state.

2. The electronic device recited in claim 1, wherein said first allotropic state is a crystalline allotrope of said semiconductor layer.

3. The electronic device recited in claim 1, wherein said second allotropic state is an amorphous allotrope of said semiconductor layer.

4. The electronic device recited in claim 1, wherein said first resistive region comprises a crystalline region being an extension of a lattice of said substrate, and said second resistive region comprises a polycrystalline region or an amorphous region.

5. The electronic device recited in claim 1, wherein said first and second resistive regions are polycrystalline, and a mean grain size of said second resistive region is about 10% or less of a mean grain size of said first resistive region.

6. The electronic device recited in claim 1, wherein said resistor is about coplanar with an interconnect dielectric layer.

7. The electronic device recited in claim 1, wherein said resistor is formed in said substrate.

8. The electronic device recited in claim 1, wherein said second resistivity is at least about 100 times said first resistivity.

* * * * *